US010741432B2

(12) United States Patent
Blahnik

(10) Patent No.: US 10,741,432 B2
(45) Date of Patent: Aug. 11, 2020

(54) SYSTEMS, APPARATUS, AND METHODS FOR A LOAD PORT DOOR OPENER

(71) Applicant: Applied Materials, Inc., Santa Clara, CA (US)

(72) Inventor: David T. Blahnik, Round Rock, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 15/426,037

(22) Filed: Feb. 6, 2017

(65) Prior Publication Data

US 2018/0226284 A1    Aug. 9, 2018

(51) Int. Cl.
*H01L 21/67*    (2006.01)
*H01L 21/677*    (2006.01)
*H01L 21/673*    (2006.01)

(52) U.S. Cl.
CPC .. *H01L 21/67772* (2013.01); *H01L 21/67389* (2013.01)

(58) Field of Classification Search
CPC ......... H01L 21/67389; H01L 21/67393; H01L 21/67772; H01L 21/67775; B65B 31/04; B65B 31/041; B65B 31/043
See application file for complete search history.

(56) References Cited

U.S. PATENT DOCUMENTS

| | | | | |
|---|---|---|---|---|
| 2,693,305 A | * | 11/1954 | Boyd | B65B 31/00 141/70 |
| 4,982,555 A | * | 1/1991 | Ingemann | B65B 31/028 53/405 |
| 6,261,044 B1 | * | 7/2001 | Fosnight | H01L 21/67772 414/217 |
| 6,817,822 B2 | | 11/2004 | Tokunaga | |

(Continued)

FOREIGN PATENT DOCUMENTS

| | | | |
|---|---|---|---|
| EP | 1842776 | * | 10/2007 |
| EP | 3333885 A1 | | 6/2018 |
| KR | 10-2009-0013097 | | 2/2009 |

OTHER PUBLICATIONS

Reuter et al., U.S. Appl. No. 15/348,964, titled: Systems, Apparatus, and Methods for an Improved Load Port Backplane, filed Nov. 10, 2016.

(Continued)

*Primary Examiner* — Andrew D StClair
(74) *Attorney, Agent, or Firm* — Lowenstein Sandler LLP

(57) ABSTRACT

Embodiments provide systems, apparatus, and methods for an improved load port operable to purge air trapped between the substrate carrier door and the carrier door opener. Embodiments include a docking tray adapted to receive a substrate carrier including a carrier door; a door opener adjacent the docking tray and adapted to couple to the carrier door and to open the carrier door, wherein the door opener includes a purge gas inlet port; at least one exhaust outlet (Continued)

port, and a ridge wall defining a perimeter channel in cooperation with a docked substrate carrier, wherein the ridge wall includes openings proximate the ports and wherein the door opener further includes a diverter structure disposed to direct purge gas from the inlet port to at least one of the openings in the ridge wall. Numerous additional aspects are disclosed.

14 Claims, 10 Drawing Sheets

(56) References Cited

U.S. PATENT DOCUMENTS

| | | | |
|---|---|---|---|
| 6,922,867 B1* | 8/2005 | Hao | B08B 5/02 |
| | | | 15/312.1 |
| 6,955,197 B2 | 10/2005 | Elliot et al. | |
| 7,726,353 B2 | 6/2010 | Okabe | |
| 8,601,975 B2 | 12/2013 | Shah et al. | |
| 8,689,812 B2 | 4/2014 | Shah et al. | |
| 8,870,512 B2 | 10/2014 | Rice et al. | |
| 2002/0124906 A1* | 9/2002 | Suzuki | H01L 21/67017 |
| | | | 141/98 |
| 2005/0111935 A1 | 5/2005 | Kim et al. | |
| 2007/0269293 A1* | 11/2007 | Yu | H01L 21/67376 |
| | | | 414/217 |
| 2011/0114129 A1 | 5/2011 | Kishkovich et al. | |
| 2012/0237323 A1* | 9/2012 | Sugawara | H01L 21/67772 |
| | | | 414/411 |
| 2012/0241032 A1* | 9/2012 | Sugawara | H01L 21/68735 |
| | | | 137/544 |
| 2012/0255713 A1* | 10/2012 | Horng | F04D 17/04 |
| | | | 165/121 |
| 2013/0000757 A1* | 1/2013 | Yoshimura | H01L 21/67772 |
| | | | 137/561 R |
| 2015/0045961 A1 | 2/2015 | Koshti et al. | |
| 2015/0221538 A1 | 8/2015 | Ochiai et al. | |
| 2016/0147235 A1 | 5/2016 | Rice et al. | |
| 2018/0204753 A1 | 7/2018 | Kawai et al. | |

OTHER PUBLICATIONS

Vincent et al., U.S. Appl. No. 15/336,279, titled: Flexible Equipment Front End Module Interfaces, Environmentally-Controlled Equipment Front End Modules, and Assembly Methods, filed Oct. 27, 2016.

Blahnik et al., U.S. Appl. No. 15/348,947, titled: Electronic Device Manufacturing Load Port Apparatus, Systems, and Methods, filed Nov. 10, 2016.

Luke W. Bonecutter, U.S. Appl. No. 15/348,961, titled: Electronic Device Manufacturing Load Port Apparatus, Systems, and Methods, filed Nov. 10, 2016.

Luke W. Bonecutter, U.S. Appl. No. 15/348,967, titled: Systems, Apparatus, and Methods for an Improved Load Port, filed Nov. 10, 2016.

International Search Report & Written Opinion of International Application No. PCT/US2018/012413 dated Apr. 26, 2018.

* cited by examiner

US 10,741,432 B2

SYSTEMS, APPARATUS, AND METHODS FOR A LOAD PORT DOOR OPENER

FIELD

The present application relates to electronic device manufacturing systems, and more specifically to systems, apparatus, and methods for a load port door opener.

BACKGROUND

Equipment front end modules (EFEMs), sometimes referred to as factory interfaces (FIs), provide a non-reactive environment for transferring substrates from carriers to processing tools. This is achieved by sealing the interior volume of the EFEM as much as is practical and flooding the interior volume with a gas such as nitrogen that is non-reactive with substrate materials. The non-reactive gas forces out any reactive gases such as oxygen from the EFEM. A load port for docking a substrate carrier attaches to the front face of an EFEM. The load port includes a door opener for removing a door from the substrate carrier docked on the load port. Air trapped between the door opener and the carrier door can seep into the EFEM and potentially contaminate substrates. However, using prior art methods and apparatus, it can be difficult, time consuming, and/or expensive to adequately purge the trapped air. Thus, what is needed are systems, apparatus, and methods for a load port door opener that facilitates purging trapped air.

SUMMARY

In some embodiments, an improved load port operable to purge air trapped between the substrate carrier door and the carrier door opener is provided. Embodiments include a docking tray adapted to receive a substrate carrier including a carrier door; a door opener adjacent the docking tray and adapted to couple to the carrier door and to open the carrier door, wherein the door opener includes a purge gas inlet port; at least one exhaust outlet port, and a ridge wall defining a perimeter channel in cooperation with a docked substrate carrier, wherein the ridge wall includes openings proximate the ports and wherein the door opener further includes a diverter structure disposed to direct purge gas from the inlet port to at least one of the openings in the ridge wall.

In some other embodiments, a load port door opener is provided. The load port door opener includes a purge gas inlet port; at least one exhaust outlet port, and a ridge wall defining a perimeter channel in cooperation with a docked substrate carrier, wherein the ridge wall includes openings proximate the ports and wherein the door opener further includes a diverter structure disposed to direct purge gas from the inlet port to at least one of the openings in the ridge wall.

In yet other embodiments, a method of purging air from a volume between a load port door opener and a substrate carrier door is provided. The method includes providing a load port including a door opener with a purge gas inlet port, at least one exhaust outlet port, and a ridge wall defining a perimeter channel in cooperation with a docked substrate carrier, the ridge wall having openings proximate the ports; docking a substrate carrier against the door opener, entrapping air in a volume therebetween including the perimeter channel; injecting purge gas into the volume via the purge gas inlet port; directing the purge gas into the perimeter channel via an opening in the ridge wall proximate the purge gas inlet port; and exhausting the air and the purge gas out of the volume via the at least one exhaust outlet port.

Still other features, aspects, and advantages of embodiments will become more fully apparent from the following detailed description, the appended claims, and the accompanying drawings by illustrating a number of example embodiments and implementations. Embodiments may also be capable of other and different applications, and its several details may be modified in various respects, all without departing from the scope of the disclosed embodiments. Accordingly, the drawings and descriptions are to be regarded as illustrative in nature, and not as restrictive. The drawings are not necessarily drawn to scale.

DETAILED DESCRIPTION

Figure 1:
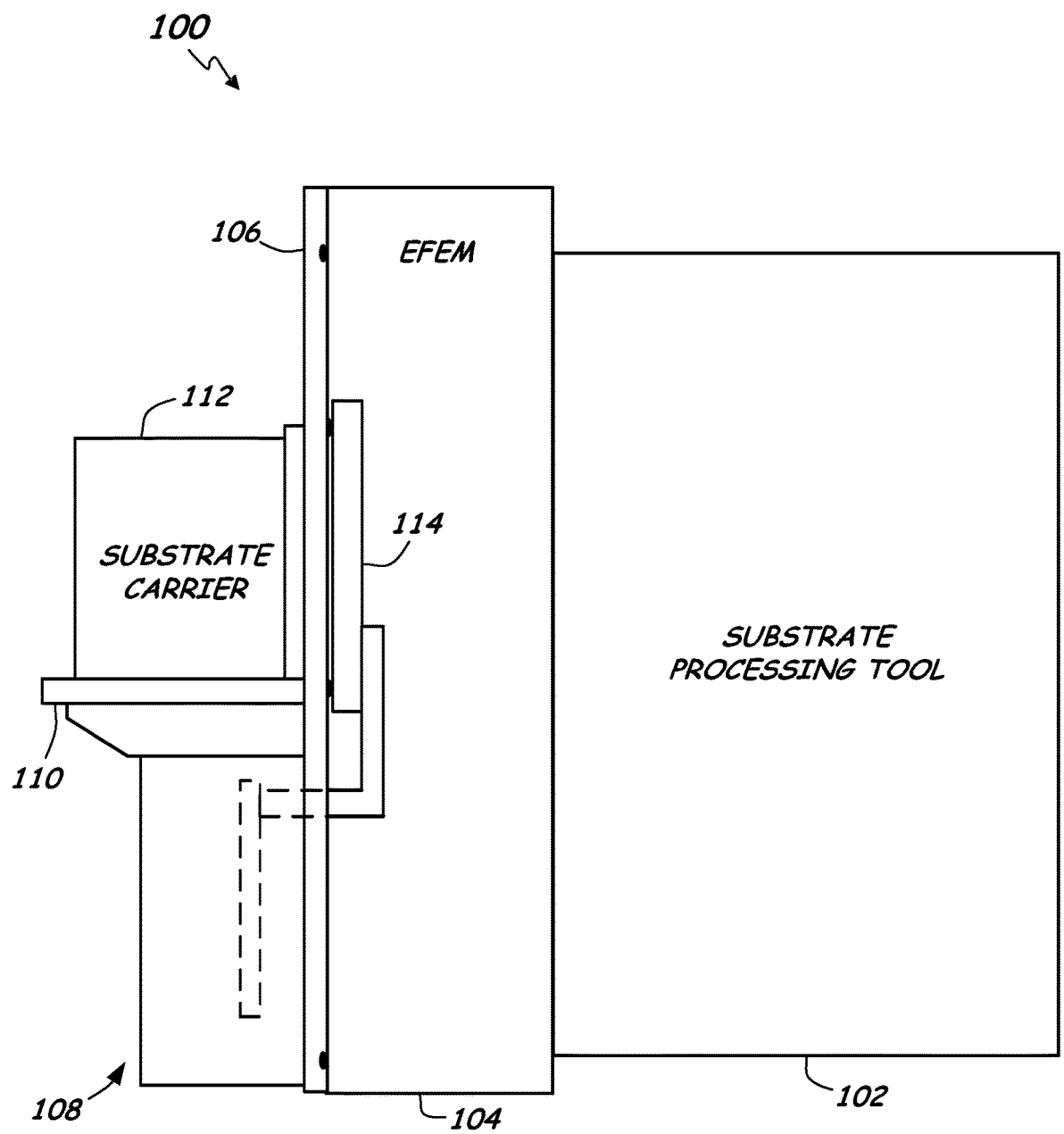
FIG. 1 illustrates a block diagram depicting an example of an electronic device processing system according to some embodiments.

As substrate (e.g., silicon wafer) processing technologies improve to higher resolutions with smaller feature dimensions, contamination from particles, moisture, and reactive gasses (e.g., oxygen ($O_2$)) become more problematic. An equipment front end module (EFEM) (sometimes referred to as a factory interface (FI)) of an electronic device manufacturing system aims to create a relatively inert (i.e., non-reactive) environment for substrates that prevents contamination of the substrates by using a non-reactive gas such as nitrogen ($N_2$) to force out all other gases (e.g., $O_2$), moisture, and other particles.

The EFEM interfaces with load ports (LPs) which facilitate the delivery of substrates from inside a substrate carrier (e.g., a front opening unified pod (FOUP)) to the rest of the system. However, prior art methods of purging the air (e.g., including $O_2$) out of the substrate carrier and the LP interface of the EFEM do not allow for certain trapped volumes of air to be purged or replaced with $N_2$. This unpurged volume of air then contaminates the non-reactive environment, and results in having to use a relatively large amount of $N_2$ flow and time to reduce $O_2$ PPM concentrations back down to an acceptable level. High purity $N_2$ is expensive, and with some EFEMs having multiple LPs and a high throughput level, $O_2$ is introduced into prior art systems relatively rapidly and is handled with a relative high rate of purging and therefore, at a relatively high cost.

Further, not only is the cost of prior art methods relatively high due to the excessive use of consumables, but the risk of substrate contamination and downtime are significantly increased using prior art methods. Embodiments disclosed herein provide systems, methods, and apparatus to remove these volumes of trapped air in a simple and cost effective manner while enabling a higher purity (e.g., a higher level of non-reactiveness) EFEM.

Embodiments provide systems, methods, and apparatus to purge trapped air volumes (1) in a perimeter channel between the edge of the substrate carrier door and the outer wall of the substrate carrier and (2) between the substrate carrier door and the LP door opener. According to embodiments, nitrogen gas is injected through a purge gas inlet port in the LP door opener and exhausted through three exhaust gas outlet ports in the LP door opener. The ports are located in the corners of the LP door opener. Due to various ridge walls and other structures, the contact face between the carrier door and a prior art LP door opener creates an area of high gas flow resistance wherein an effective flow cannot be developed across the volume to be purged to remove trapped air. By disposing the inlet and outlet ports in the corners of the LP door opener and creating openings into and out of the channel around the perimeter of the substrate carrier door, embodiments allow for the trapped air in the perimeter channel to be purged along with the air in the volume between the carrier door and the LP door opener.

In some embodiments, the openings into and out of the channel are formed by removing selected portions of the ridge walls on the contact face of the LP door opener to allow $N_2$ flow into, through, and out of the perimeter channel. Sections of the ridge walls are removed proximate to the purge gas inlet port and proximate to one of the three exhaust gas outlet ports located at a corner diagonally opposite of the inlet port. Further, $N_2$ flow is partially directed toward the ridge wall opening proximate the inlet port through the use of a diverter structure. The diverter structure partially surrounds the injection inlet port and creates an area of high pressure that pushes the $N_2$ into regions to be purged.

In operation, $N_2$ flows around the perimeter of the substrate carrier door, purging the air/oxygen, as the $N_2$ makes its way to the low pressure exhaust outlet port. Embodiments provide a balancing of the port sizes and openings in the ridge walls, as well as the port locations, ridge wall opening locations, and diverter structure locations and geometry to optimize the purging of trapped gas in the minimum time using the minimum amount of purge gas. The removal of this volume of trapped air enables efficient and cost-effective achievement of $O_2$ PPM concentration targets for ultra-high purity $N_2$ environment applications. Note that what constitutes an "ultra-high purity $N_2$ environment" is dependent on the operator and the volume of the EFEM environment in conjunction with the size and shape of the substrate carrier used. For example, ultra-high purity can be approximately 1 PPM to approximately 3 PPM $O_2$ in some applications and less than 1 PPM for others. The prior art alternative where any air that is not purged is allowed to enter the EFEM's $N_2$ non-reactive environment increases the $O_2$ concentration and contaminates the environment. Because this $O_2$ becomes diluted by $N_2$ in a relatively large volume, it will take an amount of time approximately defined by the equation $$T_{purge}=(V/Q)*\ln(C_{init}/C_{final})$$

where V represents the volume of the EFEM, Q represents the $N_2$ purge rate to rid the contamination, $C_{init}$ represents the initial $O_2$ PPM concentration, and $C_{final}$ represents the resulting target $O_2$ PPM concentration. From this relationship, the benefit of using a relatively small amount of $N_2$ (before the $O_2$ is allowed into the EFEM) to purge the volume of trapped air is clear. From the above equation, relatively large amounts of $N_2$ flow and time would be expended to rid the same volume of $O_2$ once it has been diluted in the much larger volume of the EFEM.

Figure 2:
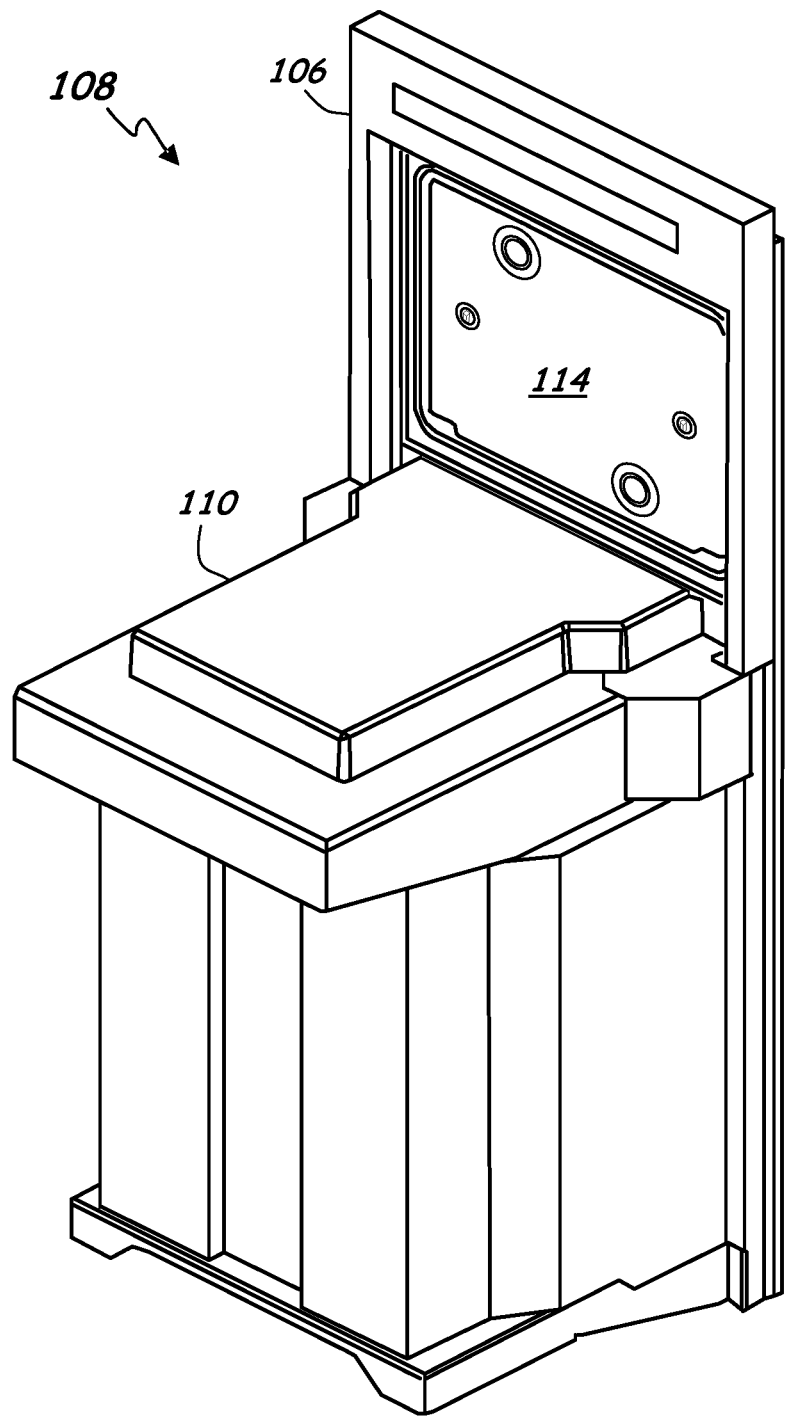
FIG. 2 illustrates a front isometric view diagram depicting an example load port according to some embodiments.
Figure 3:
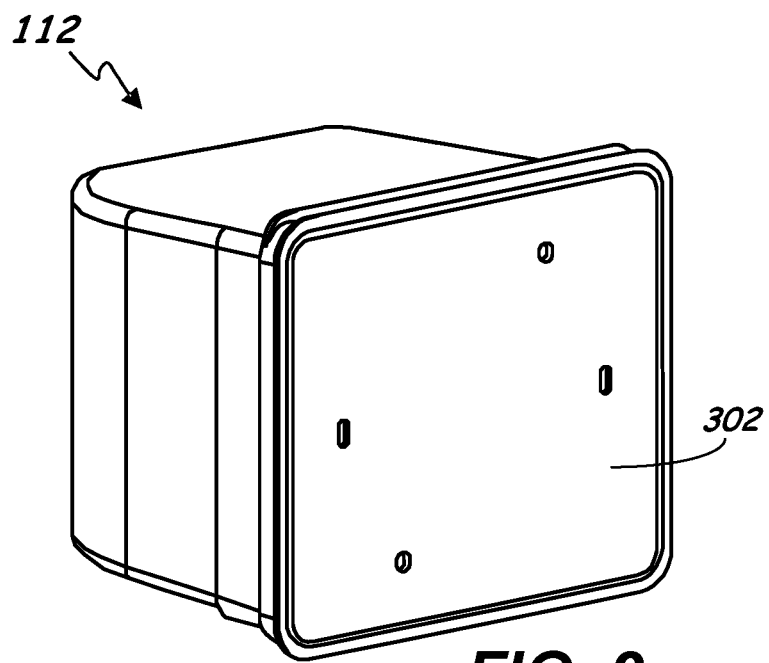
FIG. 3 illustrates an isometric view diagram depicting an example substrate carrier according to some embodiments.
Figure 4:
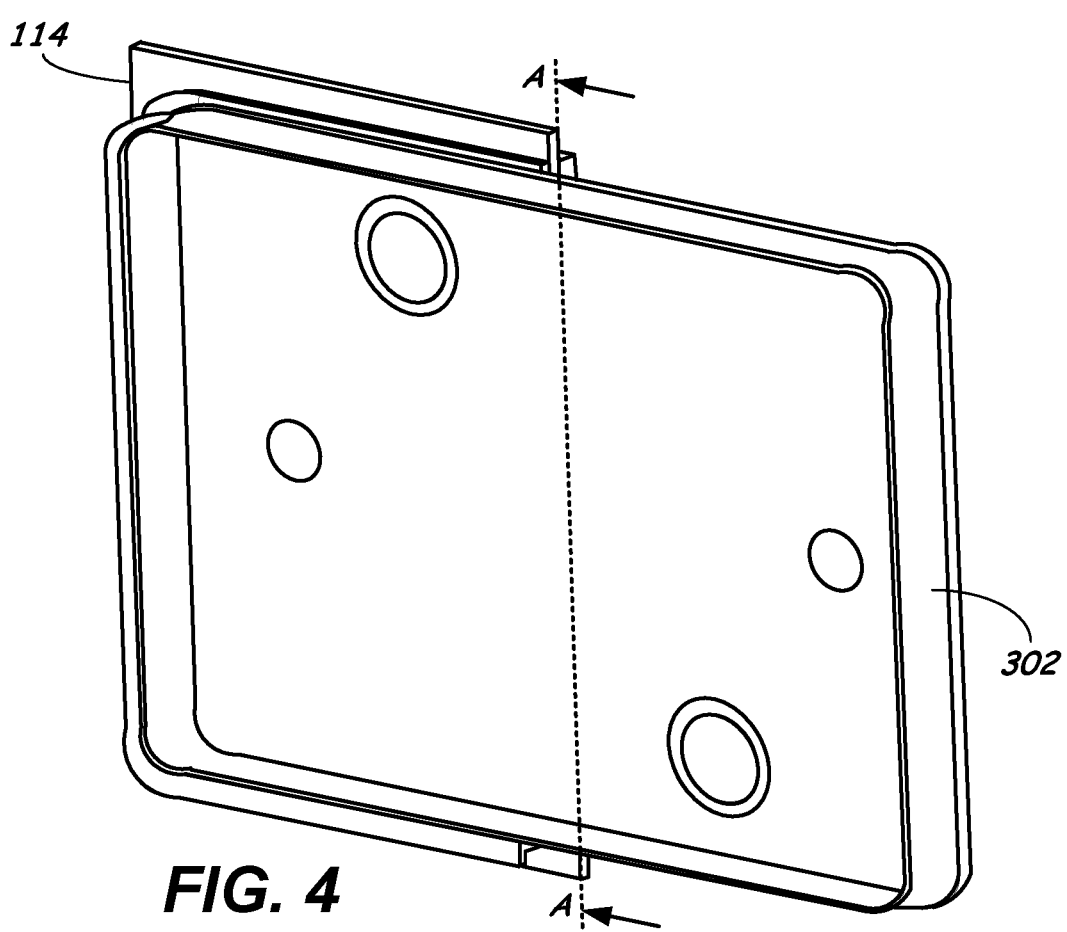
FIG. 4 illustrates an isometric view diagram depicting an example substrate carrier door against a cross-sectioned portion of a load port door opener according to some embodiments.
Figure 5:
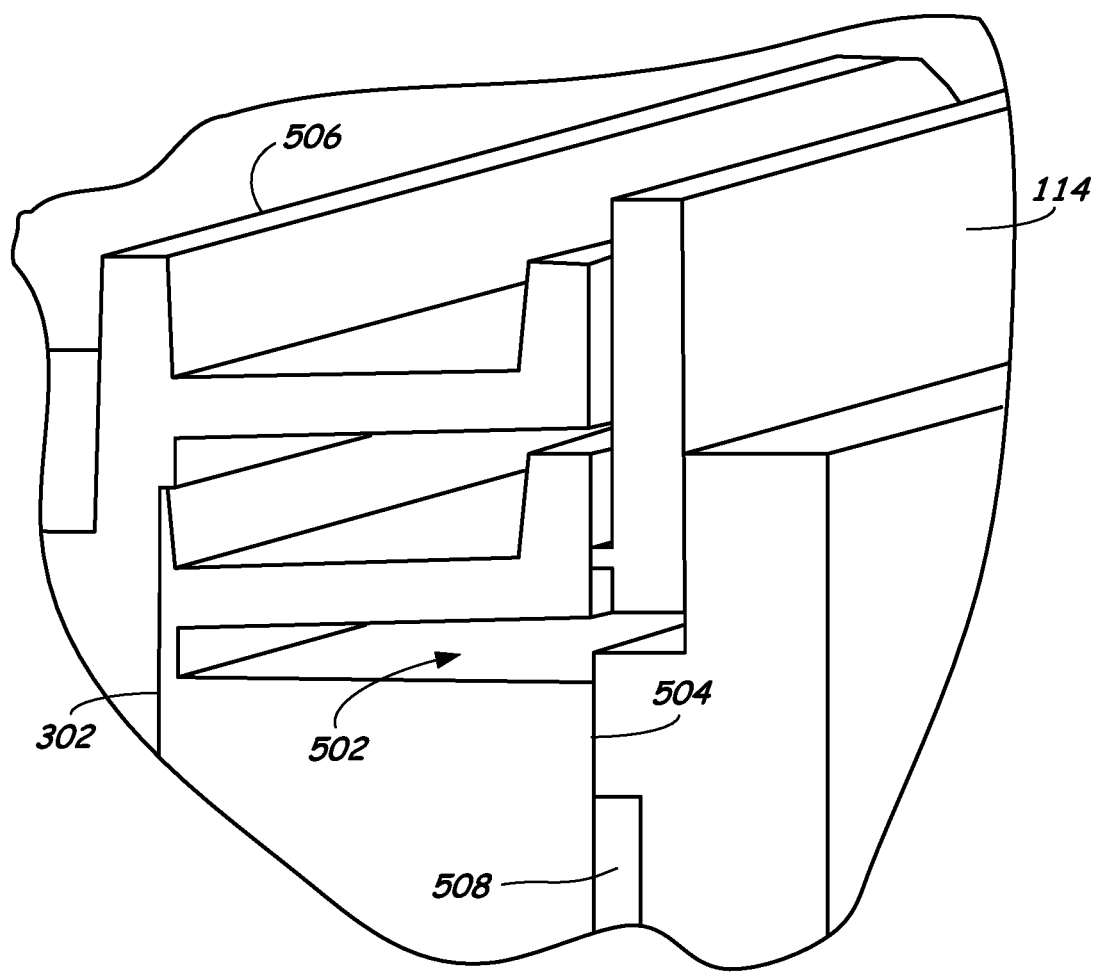
FIG. 5 illustrates a cross-sectional view diagram depicting an interface between a substrate carrier door and a door opener of load port according to some embodiments.

Turning to FIG. 1, a block diagram of an example electronic device processing system 100 according to some embodiments is shown. The system 100 includes a substrate processing tool 102 coupled to an EFEM 104. The EFEM 104 is coupled to a backplane 106 of a load port 108. A docking tray 110 of the load port 108 is adapted to support a substrate carrier 112 which can be opened by a door opener 114 of the load port 108. FIG. 2 depicts an isometric view of the load port 108 without a substrate carrier present. The contact face of the door opener 114 can be seen facing the docking tray 110 and framed by the backplane 106. FIG. 3 depicts an isometric view of a substrate carrier 112 including a carrier door 302 adapted to be docked against the door opener 114 of FIG. 2. FIG. 4 depicts an isometric inside view of the substrate carrier door 302 (without the remainder of the substrate carrier 112) positioned against a cross-sectioned (along line A-A) portion of the load port door opener 114. FIG. 5 is a magnified detailed cross-section view of a portion of the interface between the substrate carrier door 302 and the door opener 114 taken along line A-A in FIG. 4. Note the volumes such as (1) perimeter channel 502 and (2) the gap 508 between the carrier door 302 and the door opener 114 where air (including $O_2$) gets trapped when the substrate carrier 112 is docked on the load port 108. Ridge wall 504 of the door opener 114 contacts the surface of the carrier door 302 forming the volume (i.e., perimeter channel 502) defined by the carrier door 302, the ridge wall 504, and the outer wall 506 of the substrate carrier 112. Gap 508 is a volume defined by the major surface of the door opener 114, the major surface of the carrier door 302, and is surrounded on the edges by the ridge wall 504.

Figure 6:
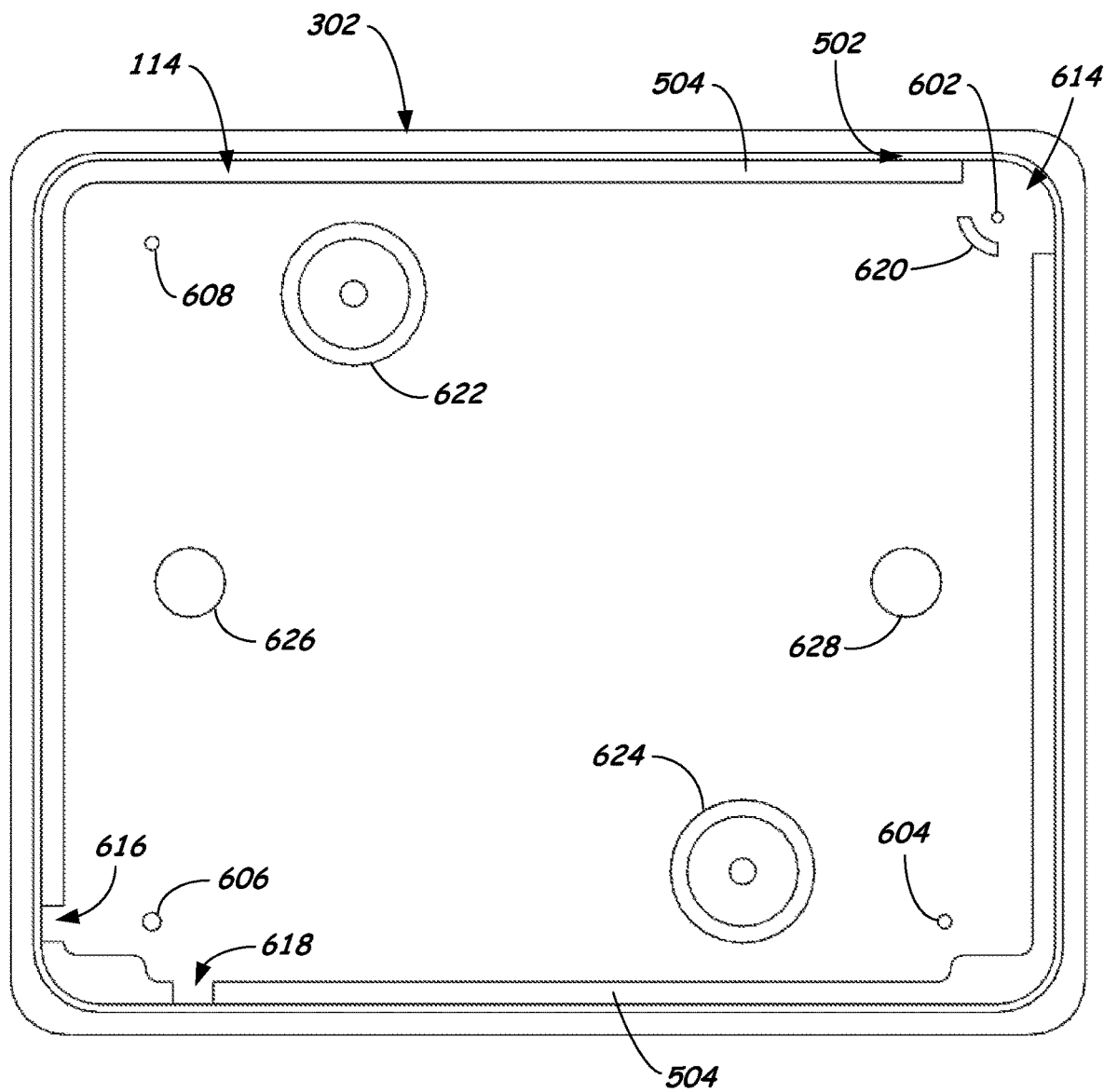
FIG. 6 illustrates a plan view diagram depicting details of a portion of a load port door opener according to some embodiments.
Figure 7:
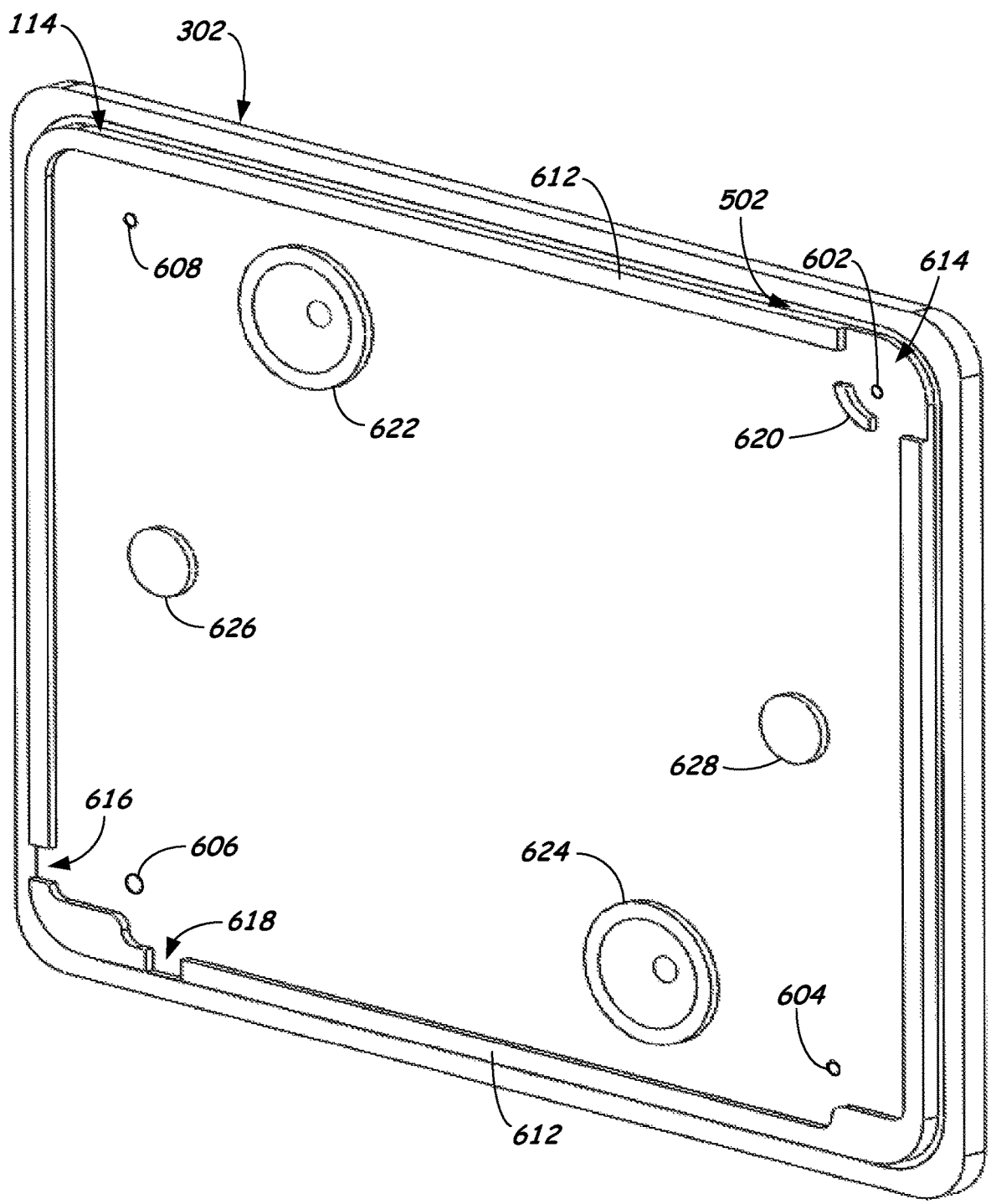
FIG. 7 illustrates an isometric view diagram depicting details of a portion of a load port door opener according to some embodiments.

Turning now to FIGS. 6 and 7, detailed plan and isometric views respectively of an example door opener 114 of a load port 108 according to embodiments are depicted. The door opener 114 is shown in contact with a substrate carrier door 302. The door opener 114 includes a purge gas inlet port 602, and three exhaust gas outlet ports 604, 606, 608, each port disposed in a different corner of the door opener 114. The perimeter of the door opener 114 includes a ridge wall 504 that includes three openings 614, 616, 618. To facilitate enhanced flow that effectively purges the air in the perimeter channel 502 and between the major surface of the door opener 114 and the carrier door 302, the openings are located in diagonally opposite corners as shown. A diverter structure 620 proximate to the purge gas inlet port 602 can be shaped like a crescent or arc-shaped and disposed to direct flow toward opening 614 in the ridge wall 504 so that gas is pushed into the perimeter channel 502. Other shapes can be used. The diverter structure 620 also helps improve the flow around other structures on the door opener 114 such as carrier door securing features 622, 624 and carrier door latch key locations 626, 628.

Figure 8:
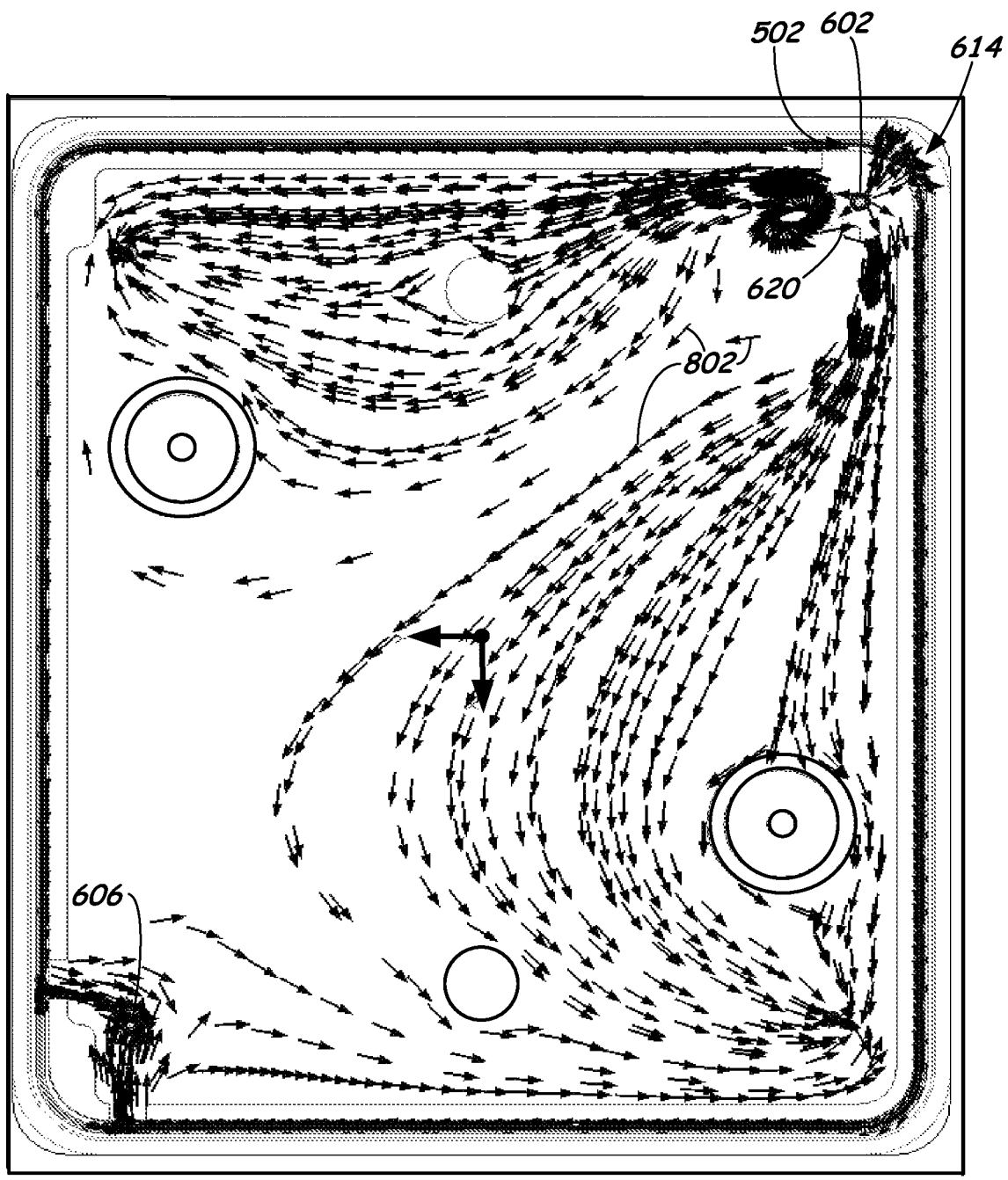
FIG. 8 illustrates a plan view wire frame diagram depicting details of gas flow between a substrate carrier door and a load port door opener according to some embodiments.
Figure 9:
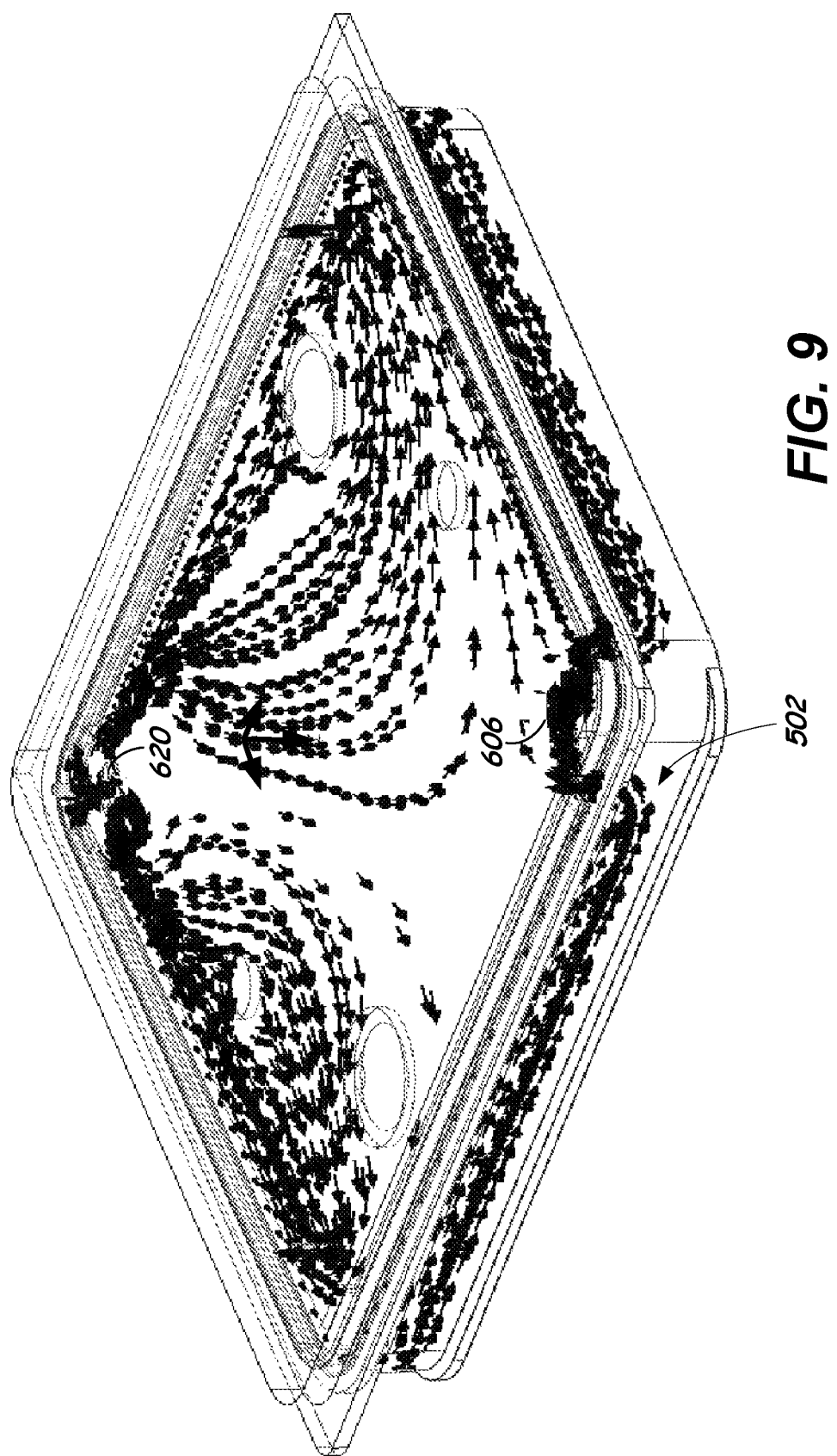
FIG. 9 illustrates an isometric view wire frame diagram depicting details of gas flow between a substrate carrier door and a load port door opener according to some embodiments.

FIGS. 8 and 9 are wire frame drawings corresponding to FIGS. 6 and 7 respectively, and illustrating an example flow pattern produced by the arrangement of ports 602, 604, 606, 608 and ridge wall openings 614, 616, 618. The multitude of arrows 802 represent gas flow. The effect of the diverter structure 620 is illustrated by the flow from the purge gas inlet port 602 through ridge wall opening 614 into the perimeter channel 502. The gases are pushed into the perimeter channel 502 by high pressure and pulled out of the perimeter channel 502 by low pressure from the exhaust gas outlet port 606 at the opposite corner of the door opener 114.

In some embodiments, the total volume to be purged between the door opener 114 and the carrier door 302 is in the range of approximately 0.1 L to approximately 0.2 L. The rate at which the purge gas (e.g., $N_2$) is injected into the volume via the purge gas inlet port 602 is in the range of approximately 1.0 LPM to approximately 10.0 LPM. The rate of flow out of each of the exhaust gas outlet ports 604, 606, 608 is in the range of approximately 0.1 LPM to approximately 10.0 LPM. In some embodiments, the time it takes to purge the volume for a load port designed to accommodate substrate carriers capable of holding 13 to 25 substrates is in the range of approximately 5 seconds to approximately 1.5 minutes. In some embodiments, the diameter of the purge gas inlet port 602 is in the range of approximately 0.125 inches to approximately 0.5 inches. In some embodiments, the size of the openings in the ridge wall is in the range of approximately 0.15 inches to approximately 2.0 inches. In some embodiments, the width and depth of the perimeter channel is in the range of approximately 0.1 inches to approximately 1.5 inches. Other rates, sizes, dimensions, times, and values are possible.

Figure 10:
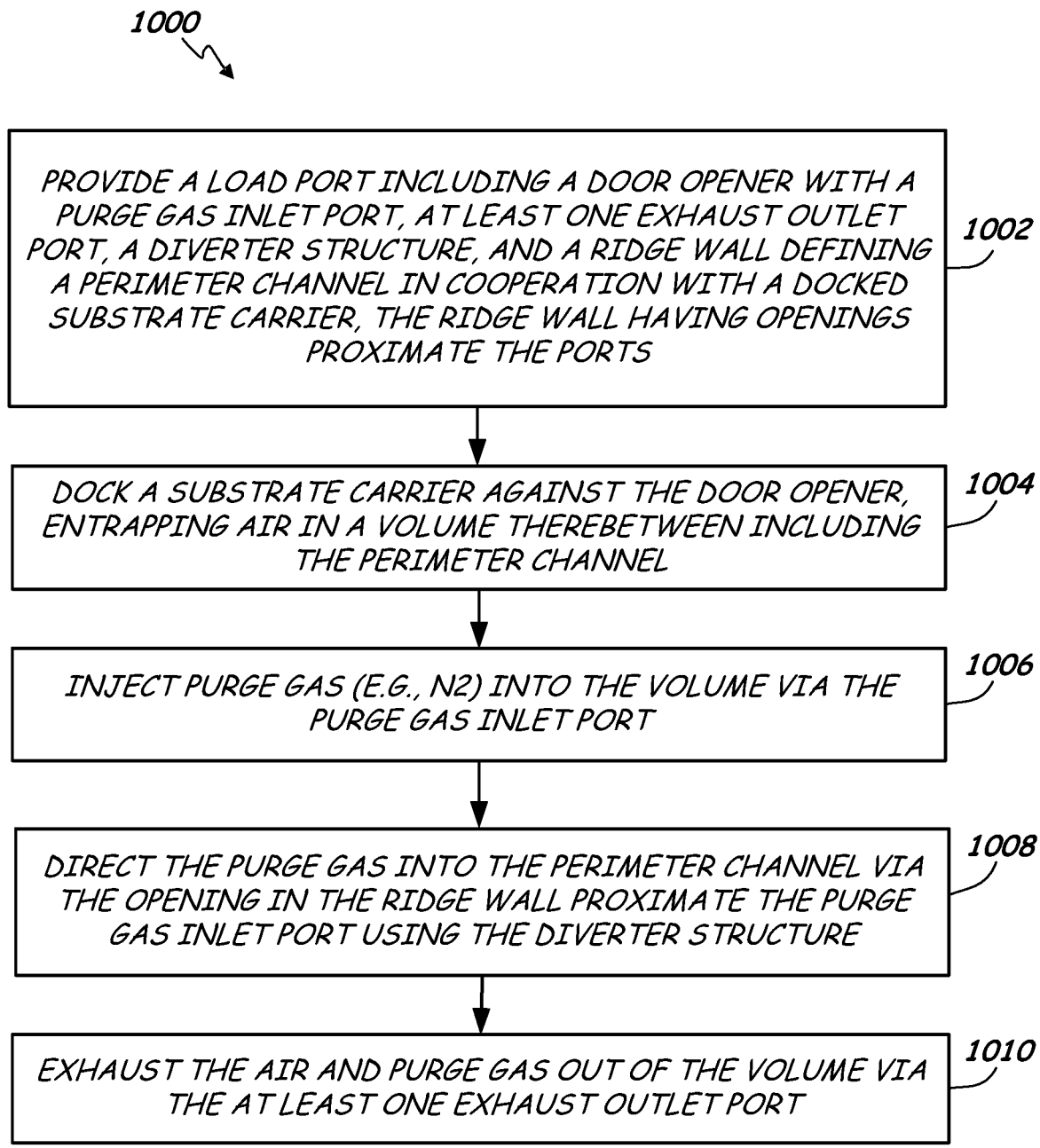
FIG. 10 illustrates a flowchart illustrating an example method according to some embodiments.

Turning now to FIG. 10, a flowchart depicting an example method 1000 of purging a volume between a load port door opener and a substrate carrier door is depicted. A load port including a door opener with a purge gas inlet port, at least one exhaust outlet port, a diverter structure, and a ridge wall defining a perimeter channel in cooperation with a docked substrate carrier is provided wherein the ridge wall includes openings proximate the ports (1002). Dock a substrate carrier against the door opener, entrapping air in a volume therebetween including the perimeter channel (1004). Purge gas (e.g., $N_2$) is then injected into the volume via the purge gas inlet port (1006). The purge gas is directed into the perimeter channel via the opening in the ridge wall proximate the purge gas inlet port by the diverter structure (1008). The air and purge gas are exhausted out of the volume via the at least one exhaust outlet port (1010).

The following example calculation is provided to illustrate the benefit of embodiments of the disclosed system over prior art methods and apparatus. Consider a system with three load ports, each with a 0.13 L volume of trapped air to be purged from between the load port door opener and a substrate carrier door. The example system includes an EFEM with a volume of 1700 L.

EFEM volume:

$$V\_Fl := 1700 \text{ L}$$

$$n_{Tot\_Fl} := \frac{(P \cdot V\_Fl)}{R_u \cdot T_{amb}} = 69.571 \text{ mol Total moles}$$

Trapped air volume:

$$V\_space := .13 \text{ L}$$

$$n_{space} := \frac{.209 \cdot 3(P \cdot V\_space)}{R_u \cdot T_{amb}} = 3.336 \times 10^{-3} \text{ mol}$$

Moles of $O2$ in $3X$ unpurged volume of .13 L $$\text{ppmFl\_with3space} := \frac{n_{space}}{n_{Tot\_Fl}} = 47.947 \cdot ppm$$

PPM effect of $O2$ from unpurged space

Figure 11:
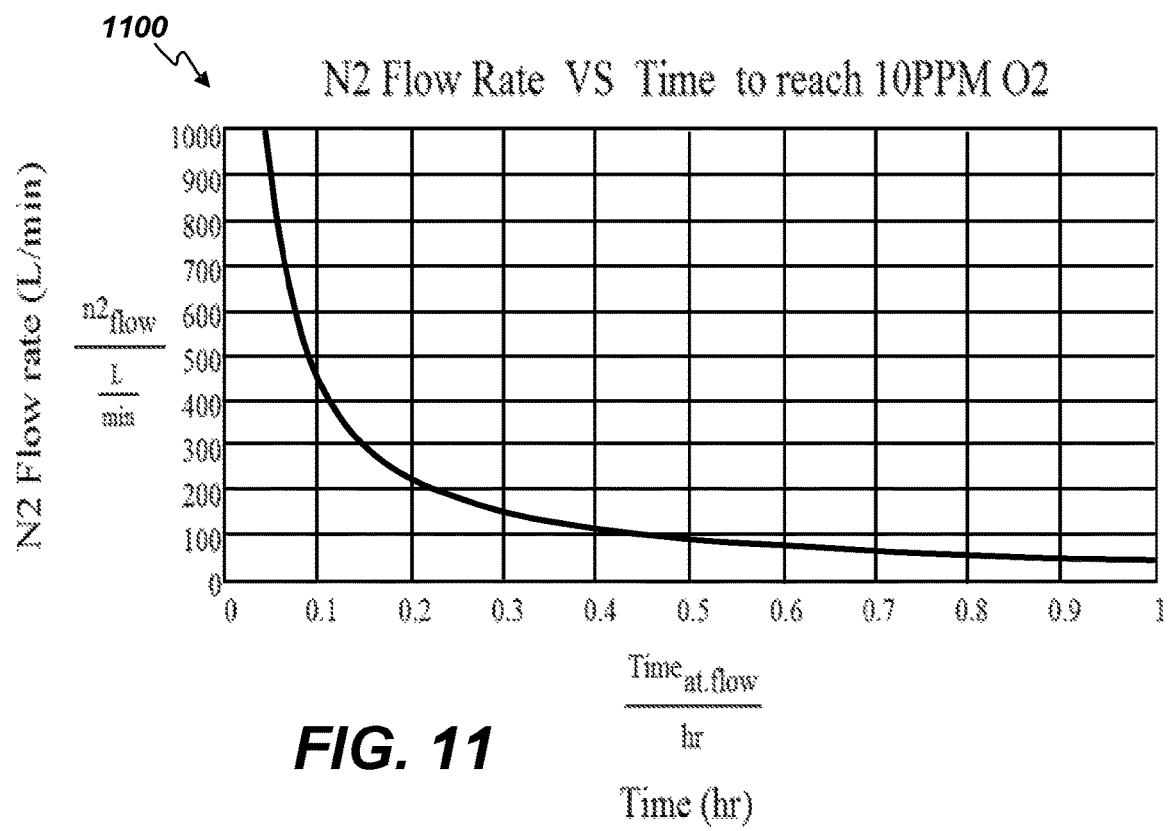
FIGS. 11 and 12 illustrate graphs depicting the relative difference in time and purge gas consumption of prior art systems and methods versus embodiments disclosed herein.

Using the prior art method of handling $O_2$ contamination by purging out the entire EFEM volume after letting the trapped air seep into the EFEM, to reduce the 47.947 PPM of $O_2$ from the EFEM volume down to 10 PPM, either 150 LPM of $N_2$ can be injected for 0.3 hours, for example, which is 2700 L of $N_2$, or 1000 LPM can be injected for 0.05 hours which is 3000 L of $N_2$. The relationship between flow rate and time to purge the example EFEM volume is depicted in graph 1100 of FIG. 11. Even assuming perfect diffusion, the variation of purge rate and time is affected by a logarithmic relationship. However, the diffusion is not going to be perfect, so the above calculations and graph 1100 represent best case consumption scenarios.

Figure 12:
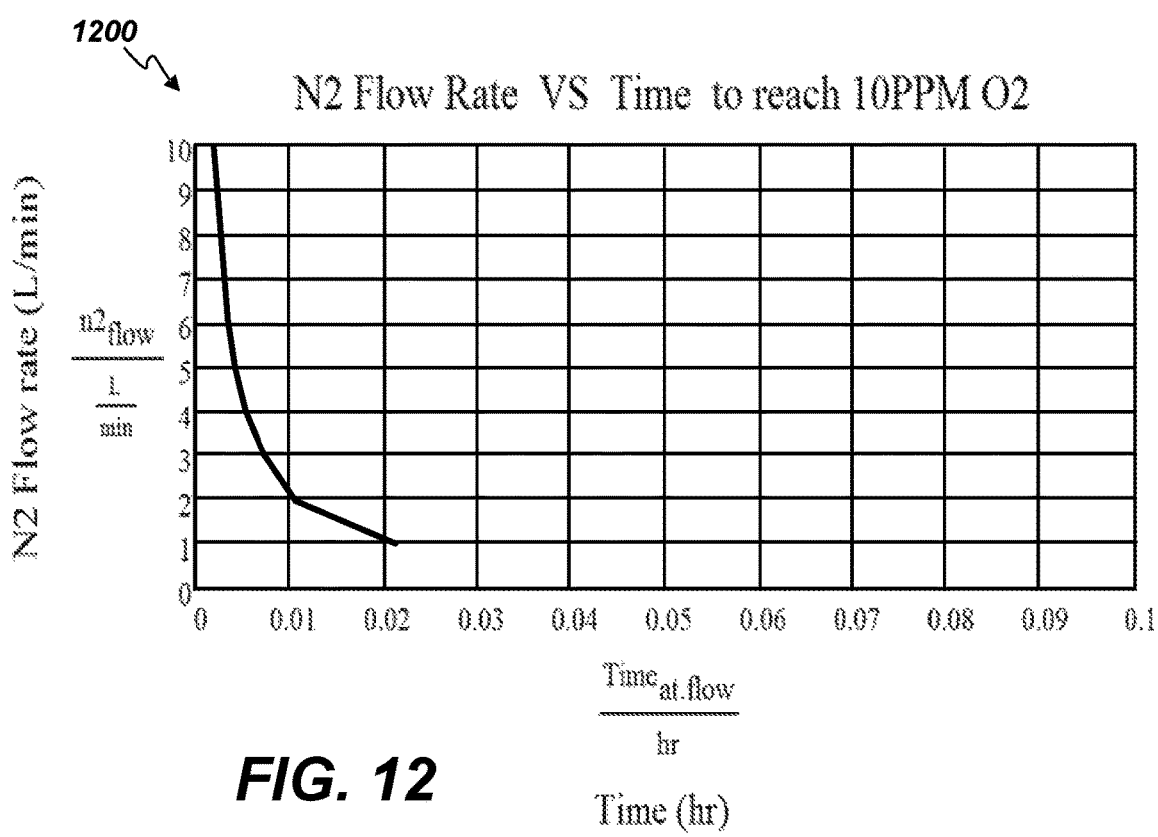

Next consider using the methods and apparatus of embodiments disclosed herein. To remove 0.13 L of air from between each of three substrate carrier doors and carrier door openers of three load ports, only 5 LPM of $N_2$ is injected into each concurrently for 0.005 hours which is only 1.5 L of $N_2$ for each load port. The trapped volume of 0.13 L is at a 209,000 PPM $O_2$ starting concentration (which is the $O_2$ concentration in standard ATM air). The relationship between flow rate and time to purge the example trapped volume of air is depicted in graph 1200 of FIG. 12. Thus, to eliminate the same volume of oxygen using the methods and apparatus of the present embodiments, a fraction of the time is used and the cost is 99.95% less by purging before the $O_2$ is allowed to seep into the EFEM.

Numerous embodiments are described in this disclosure, and are presented for illustrative purposes only. The described embodiments are not, and are not intended to be, limiting in any sense. The presently disclosed embodiments are widely applicable to numerous other embodiments, as is readily apparent from the disclosure. One of ordinary skill in the art will recognize that the disclosed embodiments may be practiced with various modifications and alterations, such as structural, logical, software, and electrical modifications. Although particular features of the disclosed embodiments may be described with reference to one or more particular embodiments and/or drawings, it should be understood that such features are not limited to usage in the one or more particular embodiments or drawings with reference to which they are described, unless expressly specified otherwise.

The present disclosure is neither a literal description of all embodiments nor a listing of features of the embodiments that must be present in all embodiments.

The present disclosure provides, to one of ordinary skill in the art, an enabling description of several embodiments. Some of these embodiments may not be claimed in the present application, but may nevertheless be claimed in one or more continuing applications that claim the benefit of priority of the present application.

The foregoing description discloses only example embodiments. Modifications of the above-disclosed apparatus, systems and methods which fall within the scope of the claims will be readily apparent to those of ordinary skill in the art. Accordingly, while the embodiments have been disclosed in connection with examples thereof, it should be understood that other embodiments may fall within the intended spirit and scope, as defined by the following claims.

The claimed embodiments include:

1. A load port system comprising:
   a docking tray adapted to receive a substrate carrier including a carrier door, the carrier door having a carrier door outer surface;
   a door opener adjacent to the docking tray and adapted to couple to and open the carrier door, the door opener having a door opener outer surface facing the carrier door outer surface while received on the docking tray, wherein the door opener includes:
   a purge gas inlet port;
   at least one exhaust outlet port;
   a ridge wall extending from the door opener outer surface and running along a perimeter of the door opener, wherein the purge gas inlet port and the at least one exhaust outlet port are located inside of the ridge wall, and wherein the ridge wall includes openings proximate to the purge gas inlet port and the at least one exhaust outlet port, the ridge wall defining a perimeter channel while in contact with the carrier door outer surface, the perimeter channel running along an entirety of the perimeter of the door opener on the outside of the ridge wall and merging into the openings; and
   a diverter structure disposed to direct purge gas from the purge gas inlet port to at least one of the openings in the ridge wall.

2. The load port system of claim 1, wherein the diverter structure is a crescent shape.

3. The load port system of claim 1, wherein the diverter structure, the purge gas inlet port, the at least one exhaust outlet port, and the openings in the ridge wall are positioned and sized to create a flow through the perimeter channel.

4. The load port system of claim 1, wherein the door opener includes three exhaust outlet ports.

5. The load port system of claim 4, wherein the purge gas inlet port and the three exhaust outlet ports are each in a different corner of the door opener.

6. The load port system of claim 1, wherein the purge gas inlet port and one of the at least one exhaust outlet port are disposed in diagonally opposite corners of the door opener.

7. A load port door opener comprising:
   a ridge wall extending from a door opener outer surface and running along a perimeter of the load port door opener, the ridge wall defining both a perimeter channel and a gap in cooperation with a docked substrate carrier, the perimeter channel and the gap defined on opposite sides of the ridge wall and the gap having a greater volume than that of the perimeter channel;
   a purge gas inlet port positioned within the gap;
   at least one exhaust outlet port positioned within the gap, wherein the purge gas inlet port and the at least one exhaust outlet port are located inside of the ridge wall;
   openings within the ridge wall proximate the purge gas inlet port and the at least one exhaust outlet port that couple the perimeter channel to the gap, the perimeter channel running along an entirety of the perimeter on the outside of the ridge wall and merging into the openings; and
   a diverter structure disposed to direct purge gas from the purge gas inlet port to at least one of the openings in the ridge wall.

8. The load port door opener of claim 7, wherein the diverter structure is a crescent shape.

9. The load port door opener of claim 7, wherein the diverter structure, the purge gas inlet port, the at least one exhaust outlet port, and the openings in the ridge wall are positioned and sized to create a flow through the perimeter channel.

10. The load port door opener of claim 7, wherein the at least one exhaust outlet port comprises three exhaust outlet ports.

11. The load port door opener of claim 10, wherein the purge gas inlet port and the three exhaust outlet ports are each in a different corner of the load port door opener.

12. The load port door opener of claim 7, wherein the purge gas inlet port and one of the at least one exhaust outlet port are disposed in diagonally opposite corners of the load port door opener.

13. The load port system of claim 1, wherein a width and a depth of the perimeter channel are in a range of approximately 0.1 inches to approximately 1.5 inches.

14. The load port system of claim 1, wherein a size of the openings in the ridge wall is in a range of approximately 0.15 inches to approximately 2.0 inches.

* * * * *